(12) United States Patent
van Schravendijk et al.

(10) Patent No.: US 7,622,162 B1
(45) Date of Patent: Nov. 24, 2009

(54) UV TREATMENT OF STI FILMS FOR INCREASING TENSILE STRESS

(75) Inventors: Bart van Schravendijk, Sunnyvale, CA (US); Seon-Mee Cho, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 191 days.

(21) Appl. No.: 11/811,048

(22) Filed: Jun. 7, 2007

(51) Int. Cl.
*H05H 1/24* (2006.01)
*B05D 3/06* (2006.01)

(52) U.S. Cl. .................. 427/553; 427/558; 427/579; 438/308; 438/788

(58) Field of Classification Search .............. 427/579, 427/553, 558; 438/308, 788
See application file for complete search history.

(56) References Cited

U.S. PATENT DOCUMENTS

| | | | |
|---|---|---|---|
| 3,983,385 A | 9/1976 | Troue | |
| 4,357,451 A | 11/1982 | McDaniel | |
| 4,563,589 A | 1/1986 | Scheffer | |
| 4,885,262 A | 12/1989 | Ting et al. | |
| 5,178,682 A | 1/1993 | Tsukamoto et al. | |
| 5,268,320 A | 12/1993 | Holler et al. | |
| 5,282,121 A | 1/1994 | Bornhorst et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,851,715 A | 12/1998 | Barthel et al. | |
| 5,858,457 A | 1/1999 | Brinker et al. | |
| 5,876,798 A * | 3/1999 | Vassiliev ............... | 427/255.18 |
| 6,136,680 A | 10/2000 | Lai et al. | |
| 6,140,252 A | 10/2000 | Cho et al. | |
| 6,150,272 A | 11/2000 | Liu et al. | |
| 6,228,563 B1 * | 5/2001 | Starov et al. ............... | 430/327 |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,329,017 B1 | 12/2001 | Liu et al. | |
| 6,340,628 B1 | 1/2002 | Van Cleemput et al. | |

(Continued)

FOREIGN PATENT DOCUMENTS

JP 01-107519 4/1989

(Continued)

OTHER PUBLICATIONS

Rodriguez, J.A., et al., "Evolution of the mechanical stress on PECVD silicon oxide films under thermal processing". Journal of Materials Science Letters 19, 2000, pp. 1399-1401.*

(Continued)

*Primary Examiner*—Bret Chen
(74) *Attorney, Agent, or Firm*—Weaver Austin Villeneuve & Sampson LLP (57) ABSTRACT

Using UV radiation, methods to modify shallow trench isolation (STI) film tensile stress to generate channel strain without adversely impacting the efficiency of the transistor fabrication process are disclosed. Methods involve a two phase process: a deposition phase, wherein silanol groups are formed in the silicon dioxide film, and a bond reconstruction phase, wherein UV radiation removes silanol bonds and induce tensile stress in the silicon dioxide film.

21 Claims, 7 Drawing Sheets

U.S. PATENT DOCUMENTS

| | | | |
|---|---|---|---|
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 | 5/2002 | Sugaya et al. | |
| 6,399,212 B1* | 6/2002 | Sakai et al. | 428/448 |
| 6,420,441 B1 | 7/2002 | Allen et al. | |
| 6,444,715 B1 | 9/2002 | Mukherjee et al. | |
| 6,467,491 B1 | 10/2002 | Sugiura et al. | |
| 6,479,374 B1 | 11/2002 | Ioka et al. | |
| 6,479,409 B2 | 11/2002 | Shioya et al. | |
| 6,485,599 B1* | 11/2002 | Glownia et al. | 156/272.8 |
| 6,531,193 B2* | 3/2003 | Fonash et al. | 427/579 |
| 6,548,113 B1 | 4/2003 | Birnbaum et al. | |
| 6,558,755 B2 | 5/2003 | Berry et al. | |
| 6,563,092 B1 | 5/2003 | Shrinivasan | |
| 6,576,300 B1 | 6/2003 | Berry et al. | |
| 6,596,654 B1 | 7/2003 | Bayman et al. | |
| 6,677,251 B1 | 1/2004 | Lu et al. | |
| 6,740,602 B1 | 5/2004 | Hendriks et al. | |
| 6,756,085 B2 | 6/2004 | Waldfried et al. | |
| 6,759,098 B2 | 7/2004 | Han et al. | |
| 6,805,801 B1 | 10/2004 | Humayun et al. | |
| 6,812,043 B2 | 11/2004 | Bao et al. | |
| 6,831,284 B2 | 12/2004 | Demos et al. | |
| 6,835,417 B2 | 12/2004 | Saenger et al. | |
| 6,848,458 B1 | 2/2005 | Shrinivasan et al. | |
| 6,884,738 B2 | 4/2005 | Asai et al. | |
| 6,921,727 B2 | 7/2005 | Chiang et al. | |
| 6,958,301 B2 | 10/2005 | Kim et al. | |
| 7,018,918 B2 | 3/2006 | Kloster et al. | |
| 7,094,713 B1 | 8/2006 | Niu et al. | |
| 7,132,334 B2 | 11/2006 | Lin | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,235,459 B2 | 6/2007 | Sandhu | |
| 7,241,704 B1 | 7/2007 | Wu et al. | |
| 7,247,582 B2 | 7/2007 | Stern et al. | |
| 7,253,125 B1 | 8/2007 | Bandyopadhyay et al. | |
| 7,265,061 B1 | 9/2007 | Cho et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,481,882 B2 | 1/2009 | Won et al. | |
| 2001/0014512 A1* | 8/2001 | Lyons et al. | 438/424 |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0117109 A1 | 8/2002 | Hazelton et al. | |
| 2002/0123240 A1 | 9/2002 | Gallagher et al. | |
| 2002/0172766 A1 | 11/2002 | Laxman et al. | |
| 2002/0195683 A1 | 12/2002 | Kim et al. | |
| 2003/0013280 A1 | 1/2003 | Yamanaka | |
| 2003/0064607 A1 | 4/2003 | Leu et al. | |
| 2003/0068881 A1 | 4/2003 | Xia et al. | |
| 2003/0134038 A1 | 7/2003 | Paranjpe | |
| 2003/0157248 A1 | 8/2003 | Watkins et al. | |
| 2003/0228770 A1* | 12/2003 | Lee et al. | 438/791 |
| 2004/0018319 A1 | 1/2004 | Waldfried et al. | |
| 2004/0023513 A1 | 2/2004 | Aoyama et al. | |
| 2004/0029391 A1 | 2/2004 | Kirkpatrick et al. | |
| 2004/0033662 A1 | 2/2004 | Lee et al. | |
| 2004/0058090 A1 | 3/2004 | Waldfried et al. | |
| 2004/0069410 A1 | 4/2004 | Moghadam et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0166240 A1 | 8/2004 | Rhee et al. | |
| 2004/0185679 A1 | 9/2004 | Ott et al. | |
| 2005/0025892 A1 | 2/2005 | Satoh et al. | |
| 2005/0112282 A1 | 5/2005 | Gordon et al. | |
| 2005/0156285 A1 | 7/2005 | Gates et al. | |
| 2005/0191803 A1 | 9/2005 | Matsuse et al. | |
| 2005/0194619 A1 | 9/2005 | Edelstein et al. | |
| 2005/0260357 A1 | 11/2005 | Olsen et al. | |
| 2005/0272220 A1 | 12/2005 | Waldfried et al. | |
| 2006/0024976 A1 | 2/2006 | Waldfried et al. | |
| 2006/0027929 A1 | 2/2006 | Cooney et al. | |
| 2006/0118817 A1* | 6/2006 | Haisma | 257/183 |
| 2006/0145304 A1 | 7/2006 | Boyanov et al. | |
| 2006/0220251 A1* | 10/2006 | Kloster et al. | 257/758 |
| 2007/0054504 A1* | 3/2007 | Chen et al. | 438/787 |
| 2007/0132054 A1 | 6/2007 | Arghavani et al. | |
| 2007/0275569 A1 | 11/2007 | Moghadam et al. | |
| 2007/0281497 A1 | 12/2007 | Liu et al. | |
| 2008/0009141 A1 | 1/2008 | Dubois et al. | |
| 2008/0020591 A1 | 1/2008 | Balseanu et al. | |
| 2008/0132055 A1 | 6/2008 | Nguyen et al. | |
| 2008/0305600 A1* | 12/2008 | Liao et al. | 438/308 |

FOREIGN PATENT DOCUMENTS

| | | |
|---|---|---|
| KP | 63-307740 | 12/2008 |
| KR | 2000-0043888 | 7/2000 |
| WO | 2006/104583 | 10/2006 |
| WO | WO 2006/104583 A2 * | 10/2006 |
| WO | 2006/127463 | 11/2006 |
| WO | WO 2006/127463 A2 * | 11/2006 |

OTHER PUBLICATIONS

Banthia et al., Strain Engineering in Non-Volatile Memories, *Reed Business Information* 2007, six pages.

U.S. Appl. No. 11/590,661, filed Apr. 6, 2009, Schravendijk et al.

U.S. Appl. No. 11/606,340, filed Feb. 5, 2009, van den Hoek et al.

U.S. Appl. No. 11/824,049, filed Mar. 19, 2009, Bandyopadhyay et al.

U.S. Appl. No. 10/982,654, filed Dec. 4, 2008, Cho et al.

U.S. Appl. No. 11/519,445, filed Dec. 10, 2008, Tarafdar et al.

U.S. Appl. No. 10/972,084, filed Dec. 30, 2008, Varadarajan et al.

U.S. Appl. No. 11/115,576, filed Apr. 22, 2009, Shrinivasan et al.

U.S. Office Action mailed Apr. 3, 2008, from U.S Appl. No. 10/982,654.

U.S. Office Action mailed Sep. 19, 2008, from U.S Appl. No. 11/824,049.

U.S. Final Office Action mailed Jul. 10, 2008, from U.S Appl. No. 10/807,680.

U.S. Final Office Action mailed Jul. 25, 2008, from U.S Appl. No. 11/146,456.

U.S. Final Office Action mailed Jul. 9, 2008, from U.S Appl. No. 10/982,654.

U.S. Office Action mailed May 14, 2008, from U.S Appl. No. 11/519,445.

U.S. Final Office Action mailed May 2, 2008, from U.S Appl. No. 11/115,576.

U.S. Office Action mailed Oct. 17, 2008, from U.S Appl. No. 11/115,576.

U.S. Office Action mailed Jul. 23, 2008, from U.S Appl. No. 11/622,423.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Jan, C.H., et al, *90NM Generation, 300mm Wafer Low k ILD/Cu Interconnect Technology*, 2003 IEEE Interconnect Technology Conference.

Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

U.S. Office Action mailed Sep. 7, 2004, from U.S Appl. No. 10/672,311.

U.S. Office Action mailed Dec. 28, 2004, from U.S Appl. No. 10/672,311.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

U.S. Office Action mailed Mar. 2, 2005, from U.S Appl. No. 10/860,340.

U.S. Final Office Action mailed Jun. 13, 2005, from U.S Appl. No. 10/860,340.

Varadarajan et al., "Tensile Dielectric Films Using UV Curing", U.S. Appl. No. 10/972,084, filed Oct. 22, 2004.

Draeger et al., "Creation Of Porosity In Low-K Films By Photo-Disassociation Of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Final Office Action mailed Jul. 13, 2005, from U.S Appl. No. 10/672,311.

U.S. Office Action mailed Jan. 10, 2006, from U.S Appl. No. 10/672,311.

U.S. Office Action mailed Mar. 29, 2006, from U.S Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S Appl. No. 10/825,888.

U.S. Office Action mailed Dec. 27, 2006, from U.S Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

Notice of Allowance and Fee Due mailed May 22, 2006, from U.S Appl. No. 10/672,311.

Allowed Claims from U.S Appl. No. 10/672 311.

Notice of Allowance and Fee Due mailed Apr. 4, 2007, from U.S Appl. No. 10/825,888.

Allowed Claims from U.S Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S Appl. No. 10/800,377.

Allowed Claims from U.S Appl. No. 10/800,377.

U.S. Office Action mailed Nov. 28, 2007, from U.S Appl. No. 10/807,680.

R.J. Lewis, Sr., Hawley's Condensed Chemical Dictionary, 12th Edition, Van Nostrad Reinhold Co., New York, 1993 (no month), excerpts pp. 916-918 & 1123-1124.

Notice of Allowance and Fee Due mailed Dec. 20, 2005, from U.S Appl. No. 10/860,340.

Allowed Claims from U.S Appl. No. 10/860,340.

U.S. Office Action mailed Dec. 12, 2007, from U.S Appl. No. 11/146,456.

U.S. Office Action mailed Oct. 3, 2007, from U.S Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Shrinivassan et al., "Multi-Station Sequential Curing of Dielectric Films," Novellus Systems, Inc., U.S. Appl. No. 11/688,695, filed Mar. 20, 2007.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.

Bhadri Varadarajan et al., "Development of High Stress SiN Films for Use with Strained Silicon Technologies"; Proc. 68th Symp. On Semiconductors and IC Tech.; Kyoto 2005.

U.S. Office Action mailed Dec. 20, 2005, from U.S. Appl. No. 10/672,311.

U.S. Office Action mailed Apr. 3, 2008, from U.S. Appl. No. 10/982,654.

U.S. Office Action mailed Sep. 19, 2008, from U.S. Appl. No. 11/824,049.

U.S. Final Office Action mailed Jul. 10, 2008, from U.S. Appl. No. 10/807,680.

U.S. Final Office Action mailed Jul. 25, 2008, from U.S. Appl. No. 11/146,456.

U.S. Final Office Action mailed Jul. 9, 2008, from U.S. Appl. No. 10/982,654.

U.S. Office Action mailed May 14, 2008, from U.S. Appl. No. 11/519,445.

U.S. Final Office Action mailed May 2, 2008, from U.S. Appl. No. 11/115,576.

U.S. Office Action mailed Oct. 17, 2008, from U.S. Appl. No. 11/115,576.

U.S. Office Action mailed Jul. 23, 2008, from U.S. Appl. No. 11/622,423.

U.S. Appl. No. 11/590,661, Office Action mailed Apr. 6, 2009.

Rodriquez, J.A. et al., "Evolution of the mechanical stress on PECVD silicon oxide films under thermal processing", Journal of Materials Science Letters 19, 2000, pp. 1399-1401.

U.S. Appl. No. 11/606,340, Office Action mailed Feb. 5, 2009.

U.S. Appl. No. 11/824,049, Office Action mailed Mar. 19, 2009.

U.S. Appl. No. 10/982,654, Office Action mailed Dec. 4, 2008.

U.S. Appl. No. 11/519,445, Office Action mailed Dec. 10, 2008.

U.S. Appl. No. 10/972,084, Office Action mailed Dec. 30, 2008.

U.S. Appl. No. 11/115,576, Office Action mailed Apr. 22, 2009.

Draeger et al., "Creation of Porosity in Low-K Films by Photo-Disassociation of Imbedded Nanoparticles," U.S. Appl. No. 12/369,384, filed Feb. 11, 2009.

U.S. Appl. No. 11/688,695, Office Action mailed Jun. 11, 2009.

U.S. Appl. No. 11/696,102, Office Action mailed Jul. 1, 2009.

Yu, J.J. et al., "UV Annealing of Ultrathin Tantalum Oxide Films", Applied Surface Science, V 186 (2002), 57-63.

U.S. Appl. No. 11/811,048, Notice of Allowance mailed Aug. 17, 2009.

U.S. Appl. No. 11/811,048, Allowed Claims.

U.S. Appl. No. 11/369,311, Office Action mailed Aug. 20, 2009.

U.S. Appl. No. 11/608,056, Office Action mailed Aug. 20, 2009.

Varadarajan et al., "Tensile dielectric films using UV curing", US Appl. No. 10/972,084, filed Oct. 22, 2004.

P. Morin et al., "Tensile contact etch stop layer for nMOS performance enhancement: influence of the morphology", ECS meeting, 2005. no page number.

Takagi et al., "High Rate Deposition of a-Si:H and a-SiN$_x$:H by VHF PECVD", Vacuum, 51, 1998. no page numbers.

Smith, D.L et al., "Mechanism of SiN$_3$-SiH$_4$ Llasma", J. Electrochem. Soc., vol. 137 (2) 1990. no page numbers.

Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.

Varadarajan et al., "Use of VHF RF plasma to deposit high tensile stress films with improved film properties for use in strained silicon technology", U.S. Appl. No. 11/975,473, filed Oct. 18, 2007.

U.S. Appl. No. 11/975,476, Office Action mailed Oct. 28, 2008.

U.S. Appl. No. 11/975,473, Office Action mailed Mar. 23, 2009.

Jiang et al., "Tensile dielectric films using UV curing", U.S. Appl. No. 11/899,683, filed Sep. 7, 2007.

U.S. Appl. No. 11/899,683, Office Action mailed May 29, 2009.

U.S. Appl. No. 11/622,409, Office Action mailed Jul. 1, 2009.

U.S. Appl. No. 11/519,445, Office Action mailed Aug. 26, 2009.

* cited by examiner

UV TREATMENT OF STI FILMS FOR INCREASING TENSILE STRESS

FIELD OF THE INVENTION

This invention relates to techniques for modifying the tensile stress in silicon dioxide films. More specifically, the invention relates to providing a high tensile stress shallow trench isolation (STI) film. The methods can be used to increase tensile stress in silicon dioxide films in transistor architectures to generate channel strain.

BACKGROUND

As transistors are scaled to smaller dimensions there is a need for higher switching speeds. One solution to increase transistor speed is to strain the silicon in the channel. Adding a small amount of strain to the silicon lattice structure promotes higher electron and hole mobilities, which increase transistor drain current and device performance.

When the lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, it randomizes their motion. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

High tensile stress films have recently been introduced to the transistor device manufacturing process. For example, methods employing high-density plasma chemical vapor deposition (HDP CVD) to deposit a high tensile stress film using a two step process of (1) depositing using sources of silicon, oxygen and in many cases hydrogen; and (2) treating the film using a high density plasma or heat. However, these treatments are expensive because they reduce the throughput of the HDP tool used to deposit the film, and they may not penetrate deeply enough into the trenches to affect the film characteristics within the trenches.

Accordingly, new modification methods for increasing STI film tensile stress are needed.

SUMMARY OF THE INVENTION

The present invention addresses this need by providing stress modification methods for increasing STI film tensile stress. The methods can be used to deposit high tensile stress silicon dioxide films in transistor architectures for generating channel strain without adversely impacting the efficiency of the fabrication process. In preferred embodiments, the methods involve at least a two-phase process: a deposition phase (first phase) and a bond reconstruction phase (second phase). In some embodiments, the first phase comprises exposing a substrate to a high-density plasma using at least a silicon-containing precursor, an oxygen source and a hydrogen source while maintaining the substrate temperature of no greater than about 400° C. to form a silicon dioxide film comprising silanol groups on the substrate. In other embodiments, the deposition may be accomplished using other methods such as sub-atmospheric chemical vapor deposition (SACVD), plasma-enhanced CVD (PECVD), spin-on deposition, rapid vapor deposition (RVD), or flowable film deposition methods. In the second phase, the silicon dioxide film is treated using ultraviolet light to remove water or —OH groups from the silicon dioxide film to induce tensile stress in the silicon dioxide film.

In one aspect, the invention is used to produce silicon dioxide film used as a dielectric in front-end-of-line (FEOL) applications such as shallow trench isolation (STD, and/or pre-metal dielectric (PMD) in an integrated circuit device. In many of the FEOL applications, the silicon dioxide film is deposited to a thickness of between about 1,000 Angstroms and about 7,000 Angstroms. The tensile stress of the silicon dioxide film produced using methods of the invention will in many cases be as high as possible, although sometimes circuit design constraints may favor a lower stress to reduce device size dependent performance variations. At very high tensile stresses cracking of the $SiO_2$ film may occur. Tensile stress may range from about 0 to 500 MPa, more typically around 200 to 300 MPa.

In some embodiments of the deposition phase, the silicon-containing precursor is a silane, such as $SiH_4$ or $Si_2H_6$. In some cases, the oxygen source is $O_2$ and the hydrogen source is $H_2$. In certain embodiments, water may be used as the oxygen source and hydrogen source. In preferred embodiments where $SiH_4$ and $O_2$ are used, the $SiH_4$ to $O_2$ ratio ($SiH_4$:$O_2$) may be at least 1:1. Other gases may also be introduced to the high-density plasma, including one or more inert gases such as He or Ar.

Also in the deposition phase, in some embodiments the substrate temperature is preferably between about −25 and about 400° C., more preferably between about 25 and about 200° C., and even more preferably between about 50 and 200° C. For a typical deposition, the substrate is exposed to the high-density plasma for less than about 420 seconds. The bias and source power will vary depending in large part on the substrate size and source gases. In embodiments where the substrate is a 200 mm or 300 mm silicon wafer, the bias power is preferably less than about 8,000 Watts and a source power is preferably less than about 8,000 Watts. In another embodiment, the substrate is a 200 mm silicon wafer, the silicon-containing precursor is $SiH_4$, the high frequency power is preferably no greater than about 2000 Watts and a low frequency power is preferably no greater than about 5000 Watts.

In the bond reconstruction phase, the treatment to remove water or —OH groups is an ultraviolet (UV) treatment. In some embodiments, the UV radiation has a power density of about 1-20 $W/cm^2$ and a wavelength from about 100-500 nm, and the exposure is conducted at ambient temperature to about 1000° C. for about 5 seconds to about 20 minutes. In other embodiments, the UV exposure may be conducted in vacuum or in a partial pressure of a reactive gas that participates in removing Si—OH bonds, such as hydrogen, forming gas, or oxygen. The gas phase may also include inert carriers such as He, Ar, Ne, $N_2$, etc. These and other aspects and advantages of the invention are described further below and with reference to the drawings.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 3A:
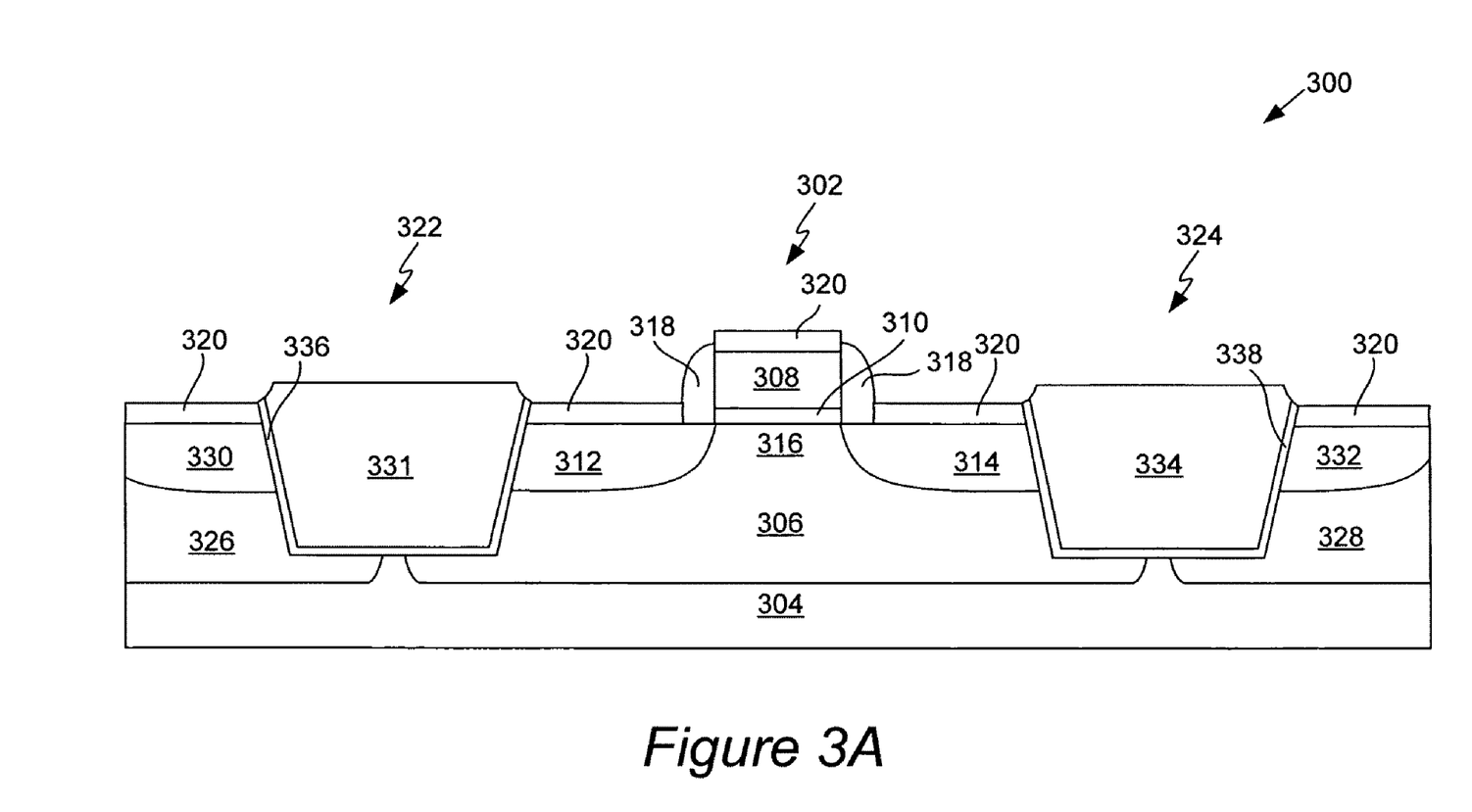
FIGS. 3A-3C depict simple transistor architectures in accordance with embodiments of the present invention.
Figure 3B:
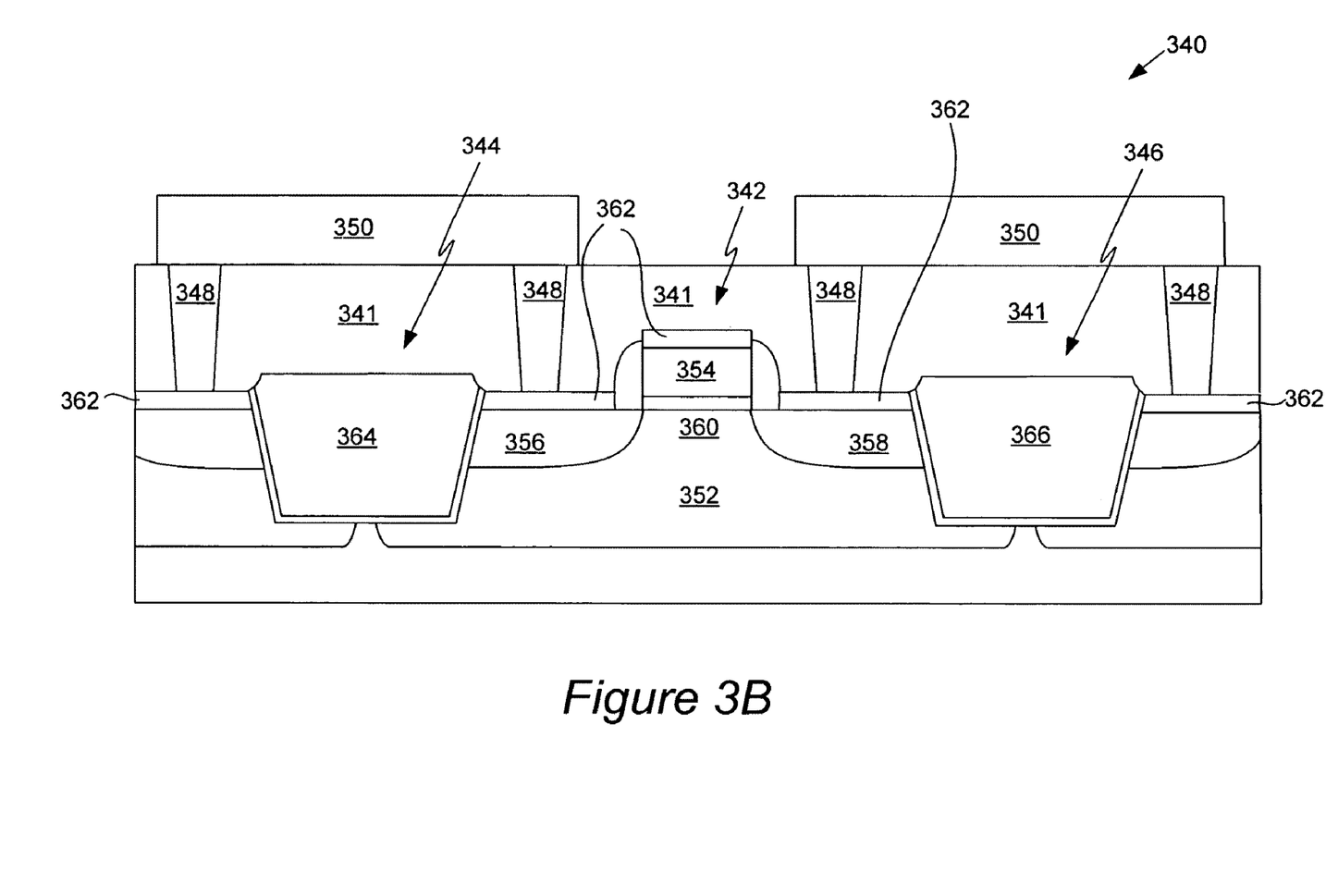
Figure 3C:
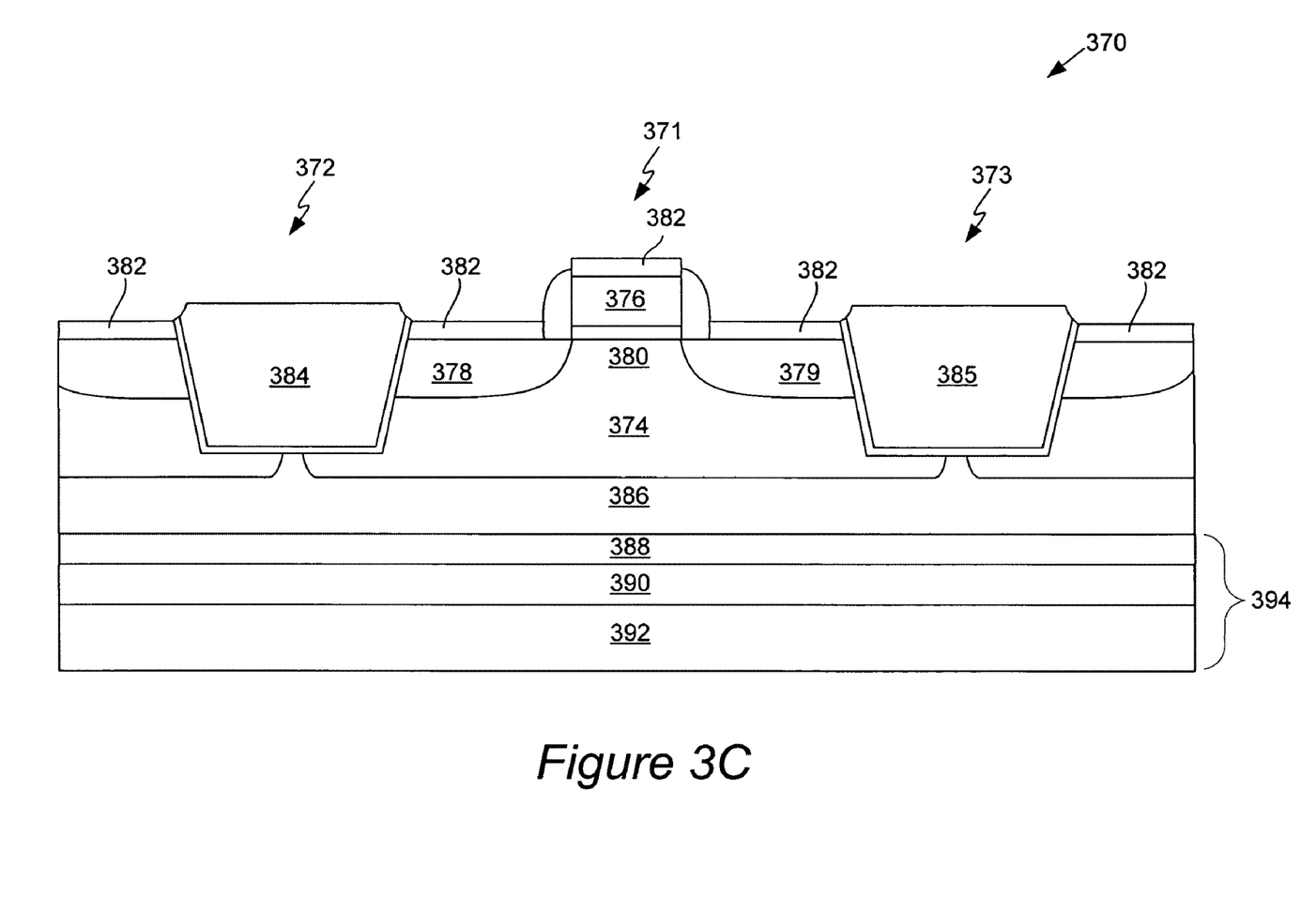

As described previously, methods of the invention can be used to produce high tensile stress oxide films useful in semiconductor wafer fabrication, especially in applications for improving strained transistor architectures. Some specific example transistor applications are described below with reference to FIGS. 5A-5C. Methods of the invention, however, are not limited to these transistor applications, or any other particular application. Note that to the extent that the invention applies to semiconductor wafer fabrication, the words "wafer", "wafer substrate" and "substrate" will be used interchangeably and the words "film" and "layer" will be used interchangeably herein. "Silicon dioxide," as used in this application, is not limited to stoichiometric two oxygen atoms to one silicon ratio. Instead, silicon dioxide refers to a broad range of silicon oxides having about two oxygen atoms to one silicon, including about greater than one oxygen to one silicon up to about three oxygen atoms to one silicon in the film.

The present invention relates to stress modification methods for increasing STI film tensile stress. The methods can be used to deposit high tensile stress silicon dioxide films in transistor architectures for generating channel strain without adversely impacting the efficiency of the fabrication process. Examples include dielectric gap fill applications such as shallow-trench isolation (STI) structures and pre-metal dielectric (PMD) layers.

HDP techniques are typically the method of choice for many gap fill deposition applications because they can provide void-free high-quality dielectric films, even in high aspect ratio device structures. The basis for the improved gap filling capability is that HDP sources can provide a high density of low energy ions to the wafer surface. During CVD deposition the ions can simultaneously sputter the film. The sputtering can remove material from some regions on the wafer surface more rapidly than other regions, resulting in films that can fill narrow gaps with no voids.

HDP methods are not only used in gap filling depositions. In many traditional HDP applications, gap fill or otherwise, silicon dioxide films are deposited with the goal of attaining dense films. Unlike other deposition processes, HDP techniques can be used to produce dense films. For example, HDP methods can produce silicon dioxide films almost as dense as thermally grown silicon dioxide. These dense films can be produced because the high density plasma is extremely effective at breaking up the deposition precursors into their smallest possible molecular fragments, which minimizes impurity incorporation and allows for a dense Si—O network. The high density of the silicon dioxide film results in compressive stress mostly due to thermal mismatch of the $SiO_2$ film with the silicon substrate.

Methods of the present invention use HDP methods to produce silicon dioxide films with high tensile stress. In contrast to compressive stress, tensile stress is the stress state of a material leading to expansion of the internal atomic network. For silicon dioxide films, tensile stress leads to the expansion of the Si—O network. Tensile and compressive stress can be measured in units of force divided by area, usually as Pascals or $dynes/cm^2$, and are well defined within the art and will not be discussed in detail herein. Any suitable method for measuring tensile stress may be used. For example, standards for measuring compressive and tensile stress of materials described by the American Society for Testing and Materials (ASTM) may be used. Measures of tensile stress presented herein may be made with a suitable commercially available apparatus. The stress in the film as deposited is measured by comparing wafer bow before and after deposition by scanning a laser across the surface and measuring its angular deflection. The stress in the film at the end of processing is not easily measured, but that is the stress that induces strain which affects device performance.

Methods of the invention are used to produce high tensile stress, high quality silicon dioxide and doped silicon oxide films. The present invention utilizes a two-phase process to form the high tensile stress silicon dioxide films. The two-phase process allows for modulation of the stoichiometric structure of the Si—O network. In some embodiments of the deposition phase, an HDP method is used to deposit a silicon dioxide film comprising hydroxyl (—OH) groups, more specifically, silanol (Si—OH) groups. In the second phase, the deposited silicon dioxide film is treated with UV radiation to remove at least water and/or —OH groups and reconstruct bonds within the film, thereby inducing tensile stress in the film.

In most traditional applications, hydroxyl groups are considered impurities within a silicon dioxide film and are generally discouraged. That is, conventionally, it is believed that the incorporation of hydroxyl groups can weaken the silicon dioxide structure, resulting in poorer quality oxides. More specifically, in a typical silicon dioxide deposition process, the following reactions are preferred:

Thus, in a typical silicon dioxide deposition, silane ($SiH_4$) combines with oxygen ($O_2$) to form a silicon dioxide ($SiO_2$) film and hydrogen gas ($H_2$) and water.

In contrast, for methods of the present invention, it is preferable that some hydroxyl groups are incorporated within the silicon dioxide film. For example, if $SiH_4$, $O_2$, and $H_2$ are used, the following reactions will preferably occur in the deposition phase (phase 1) and the water removal phase (phase 2):

$$Si\text{---}OH + HO\text{---}Si \rightarrow Si\text{---}O\text{---}Si + H_2O \text{ (vapor)}$$

$$Si\text{---}OH + Si\text{---}H \rightarrow Si\text{---}Si + H_2O$$

$$Si\text{---}OH + Si\text{---}H + \tfrac{1}{2}O_2 \rightarrow {}_{Si\text{---}O\text{---}Si+H2}O$$

$$2\,Si\text{---}OH + \tfrac{1}{2}O_2 \rightarrow Si\text{---}O\text{---}Si + H_2O$$

$$2\,Si\text{---}OH + H_2 \rightarrow Si\text{---}Si + 2H_2O \quad \text{phase 2}$$

Thus, in the deposition phase (phase 1), in addition to silicon dioxide, silanol groups are formed within the silicon dioxide network. Evidence of these silanol groups has been confirmed using FTIR analysis of the film. It should be noted that for methods of the invention, the reactants in the deposition phase are not limited to $SiH_4$, $O_2$, and $H_2$. In preferred embodiments, at least a silicon-containing precursor, an oxygen-containing species and a hydrogen-containing species are used. In some embodiments, the oxygen-containing species and a hydrogen-containing species exist in one species, for example, water. While not wishing to be bound by theory, it is believed that temperature during deposition affects the extent of silanol formation. Hydrogen may suppress the oxidizing capability of the oxidizing agents in the plasma, thereby decreasing formation of silanol groups. In general, the more silanol groups are formed in the film, the higher the tensile stress in the resultant film (i.e., after the second phase of treatment). Thus, one can control the amount of tensile stress in the resultant film by controlling the substrate temperature and the amount of hydrogen in the high-density plasma. Note that other process parameters may also be varied to control the extent of silanol formation and will be discussed below.

In the bond reconstruction phase (phase 2), as shown above, the silanol groups (Si—OH) and Si—H may combine to form bridging oxygen atoms (Si—O—Si) and Si—Si bonds and create water as a byproduct. In certain embodiments, the UV radiation may also break Si—O bonds. The water is typically driven off in vapor form during the process of phase 2. While the invention is not limited by this theory, it is generally believed that tensile stress develops in silicon dioxide film from the reduction of the amount of water in the film. The loss of water and —OH groups results in a volume change in the film, but the constraint of the substrate prevents any lateral shrinkage, thus imposing tensile stresses in the film. In general, the more water and —OH groups are removed in the second phase, the higher the tensile stress in the resultant film. Thus, one can also control the amount of tensile stress in the film by controlling the extent of bond reconstruction and water and —OH group removal. The extent of bond reconstruction and water and —OH group removal can be controlled by varying any of a number of process parameters including substrate temperature and substrate exposure time. Note that other process parameters may also be varied to control the extent of bond reconstruction and will be discussed below.

A more detailed description of preferred embodiments of the two-phase process will be described below with reference to the flow chart of FIG. 1.

Process

Figure 1:
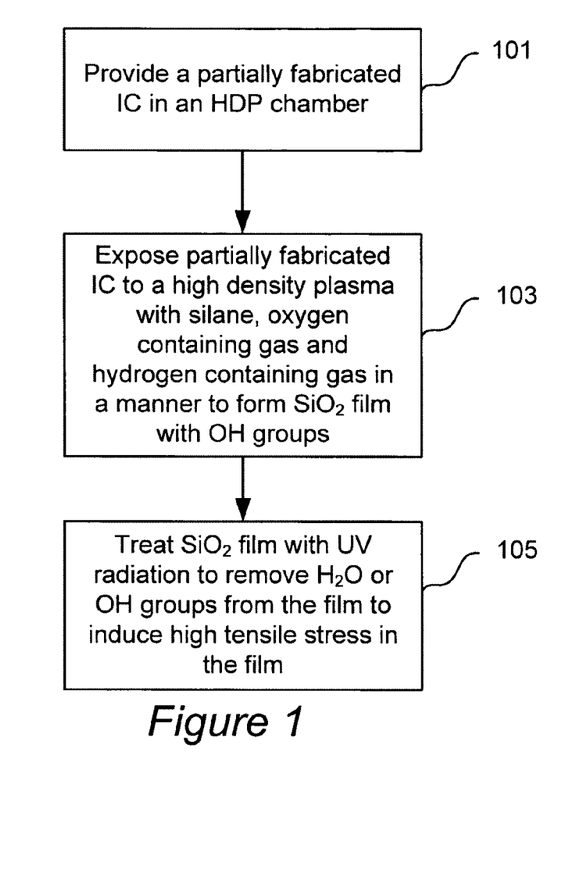
FIG. 1 is a flowchart summarizing stages of a general process and a preferred implementation of the invention for forming high tensile stress silicon dioxide films.

FIG. 1 is a flowchart summarizing a high-level process flow for preparing a high tensile stress oxide in accordance with preferred embodiments of the present invention. This flowchart is representative of some embodiments of the invention and is not intended to encompass all possible embodiments of the invention. The following is a detailed description of the processes outlined in the flowchart.

In the flowchart of FIG. 1, as represented by process block 101, first a partially fabricated integrated circuit is provided in a HDP reactor or chamber. As described above, the partially fabricated integrated circuit is preferably in a FEOL stage of wafer processing, i.e., a stage before deposition of the first metal layer. An example of a suitable HDP reactor is described below with reference to FIG. 4.

Once provided, the substrate is exposed to a high density plasma comprising a silicon-containing precursor, an oxygen source and a hydrogen source to form silicon dioxide film with hydroxyl groups incorporated within (block 103). Preferably, a sufficient amount of hydroxyl groups will be formed to result in a film with a tensile stress of about 50 MPa or more, more preferably 100 MPa or more. However, the amount of hydroxyl groups will preferably not be so great as to critically sacrifice the integrity of the film. It should be noted that because HDP processes are used, process conditions can be tuned to provide films with any stress level, including compressive films, tensile films and zero stress films. Thus, methods of the invention can be used tune the process conditions so as to provide an appropriate amount of tensile stress for a particular need.

As mentioned previously, HDP methods involve the use of high densities of ions that can produce dense, defect free and void free films and are therefore not conventionally well suited for creating silicon dioxide films with hydroxyl defects. However, in accordance with the present invention, a number of conditions in a HDP process can be chosen to increase or decrease the likelihood of formation of hydroxyl groups. In general, for HDP methods, hydroxyl formation can increase with decreasing substrate temperature, decreasing RF source power, decreasing bias power, and increasing substrate to bottom of inductive coil distance. A summary of how these and other process parameters are expected to affect the tensile stress within a silicon dioxide film are described below.

For methods of the invention, it has been found that using substrate temperatures no greater than about 400° C. are preferred. More preferably, substrate temperatures between about −10 and about 400° C., even more preferably between about 25 and about 250° C., are used. At these temperatures, a low density film is deposited, which may be made more tensile by removing the —OH groups. Preferred bias and source powers will vary depending in large part on the wafer size and process gases. However, it has been found that the bias power should be low so as to prevent too much ion bombardment during deposition. Conditions that allow too much ion bombardment can cause the film to revert to a compressive film by adding further Si—O bonds in the film via a bond insertion mechanism. The LFRF power is also preferably low to prevent any possible ion bombardment.

For a 200 mm or 300 mm wafer, the bias power is typically no greater than about 8,000 Watts and the source power is typically no greater than about 8,000 Watts. In a typical case where a 200 mm wafer was treated using $SiH_4$ as the silicon-containing precursor source gas, the bias power is typically no greater than about 2000 Watts and the source power is typically no greater than about 5000 Watts. In some preferred embodiments, the bias power to source power ratio ranges between about 1:3 and about 2:3. The source frequencies will typically range between about 100 KHz and about 2.5 GHz and the bias frequencies will typically range between about 50 KHz and about 50 MHz.

Any suitable silicon containing reactant gases may be used to deposit the silicon dioxide film. In preferred embodiments, the silicon-containing precursor is a silane, such as $SiH_4$ or $Si_2H_6$. Other possible silicon-containing precursors include suitable carbon-containing silanes such as methyl silanes, dimethyl silanes, and trimethyl silanes. In addition, siloxanes or silanol compounds may be used. Of course, a combination of two or more silicon-containing precursors may also be used. In some preferred embodiments, the oxygen source is $O_2$ and the hydrogen source is $H_2$. In other preferred embodiments, the oxygen source and hydrogen source exist in one species, such as water. Water may also be used in combination with $O_2$ and/or $H_2$. In preferred embodiments where $SiH_4$ and $O_2$ are used, the $SiH_4$ to $O_2$ ratio is between about 1:4 and about 2:3. Suitable carrier gases include helium (He), argon (Ar), carbon dioxide ($CO_2$), methane ($CH_4$) and nitrogen ($N_2$). It should be noted, however, that in some embodiments, it is preferable that no inert gas is used in addition to the reactant gases (i.e., silicon-containing precursor, oxygen source and hydrogen source). Duration of exposure to the high density plasma will depend at least in part on the desired thickness of the silicon dioxide film. Exposure times will preferably be less than about 420 seconds, more preferably less than about 120 seconds.

Returning to FIG. 1, the silicon dioxide film is next be treated to remove water and —OH groups from and promote bond reconstruction within the film (block 105) by using UV radiation. A number of suitable combinations of methods may be used also, such as UV radiation on a temperature-controlled pedestal (i.e. the wafer is heated by absorption of the UV but the pedestal is cooled to keep a constant temperature), or UV radiation through plasma. The method will preferably remove a sufficient amount of water and —OH groups to result in a film with a tensile stress of about 50 MPa or more, more preferably 100 MPa or more.

The choices of UV wavelength(s), total exposure time and intensity, etc., depend on a number of factors, including the thickness of the STI film and the composition of the STI film. A typical UV exposure in accordance with this aspect of the invention has a power density of less than 20 W/cm$^2$, e.g., 500 mW/cm$^2$-5 W/cm$^2$ in either inert (e.g., He, Ar, forming gas, or $N_2$) or oxidizing environments (e.g., in an anneal environment that comprises one or more of oxygen, ozone, peroxide or nitrous oxide). In some embodiments, the UV radiation a wavelength from about 100-500 nm, and the exposure is conducted at ambient temperature for less than about 20 minutes, preferably less than 2 minutes.

In oxidizing environments, oxygen can promote bond breaking thereby facilitating —OH removal. The UV source can be a single wavelength excimer laser or lamp or broad spectra source with arc or microwave excitations. The wavelength can be from about 100 nm-500 nm, preferably from about 100-400 nm. The process pressure can range from about vacuum to 2 atmospheres, preferably from about 1 Torr to 200 Torr. The UV radiation may even be directed through a plasma of He, Ar, $N_2$, $N_2O$, $NO_2$, $O_2$, $CO_2$ or a mixture of them. The wafer temperature can be set at from about 25° C. to 1000 C, preferably less than 700° C.

If a plasma is used in addition to UV radiation, the bias power will preferably be off or very low so as to prevent ion bombardment of the deposition film. In the same manner stated above for the deposition process, conditions that allow too much ion bombardment can cause the film to revert to a compressive film by adding further Si—O bonds in the film via a bond insertion mechanism. The source power is also preferably low enough to prevent too much ion bombardment but should be high enough to aid water removal. For a 200 mm wafer, the source will typically be between about 2000 and 8000 Watts. In preferred embodiments, the substrate temperature ranges between about 200 and about 800° C.

For embodiments where a thermal process is used in conjunction with UV radiation, the substrate temperature is preferably less than 700° C. for STI and ranges between about 400 and about 500° C. for other films. In preferred embodiments, the thermal treatment can occur in an inert environment such as under vacuum or in the presence of an inert gas such as He, Ar, $N_2$ or a combination thereof. Other gases, although not fully inert, may also be used, such as $CO_2$ and $CH_4$. Alternatively, the UV treatment can occur in the presence of an oxidizing gas, for example, in the presence of oxygen. The use of an oxidizing gas can aid the water and —OH removal process. Oxygen, in particular, has been found to be a strong oxidizing gas in this application. While not wishing to be bound by theory, it is believed that the oxygen or other oxidant species assists in breaking the Si—OH bonds and forming Si—O—Si networks. It is preferable that reducing gases, such as hydrogen, not be used since they may react with the film. Thus, one can tune the amount and/or rate of water and —OH removal (i.e., tune the amount of stress induced in the film) by controlling the amount of oxidizing gas present during the UV treatment.

After the bond reconstruction and —OH removal operation (105), the tensile stress of the silicon dioxide film will preferably be 50 MPa or greater, preferably in about the 200 Mpa to about 300 MPa range. For most FEOL applications, the silicon dioxide film is typically deposited to a thickness between about 1,000 and 6,000 Angstroms, more typically about 3000 to 5000 Angstroms. A PMD layer may be up to 10,000 Angstroms for current technologies. Methods of the invention are not limited to any particular film thickness. However, if a thick silicon dioxide film is needed, the deposition and post-deposition treatments (blocks 103 and 105) can be repeated to provide the extra thickness.

In certain embodiments, after inducing tensile stress in STI, another compressive STI layer may be deposited, creating a bi-layer STI. The compressive STI layer improves the uniformity during subsequent polishing by countering any flex (bowing) of the wafer due to the tensile STI layer.

It is worth mentioning that after the bond reconstruction and water and —OH group removal process (105), the resultant silicon dioxide film is generally stable and not generally susceptible to re-incorporation of water or —OH groups. Re-incorporation of water or —OH groups, often referred to as hydrolysis, occurs when a film is exposed to ambient atmosphere and water from the ambient atmosphere absorbs into the film. Films that are deposited using standard CVD and PECVD methods can be susceptible to hydrolysis since these films are typically not very dense and can more readily allow water and —OH groups to incorporate into the atomic lattice structures. As mentioned previously, the films produced using methods of the present invention can be relatively dense even though they possess high tensile stress.

Examples

The following examples are presented to help illustrate aspects of the invention. These examples are representative only, and that the invention is not limited by the detail set forth in these examples. In additions, the following examples show process conditions for depositing and treating high tensile stress silicon dioxide films for experimental purposes and may not necessarily represent optimized conditions for depositing films for any particular specific device application.

Figure 2:
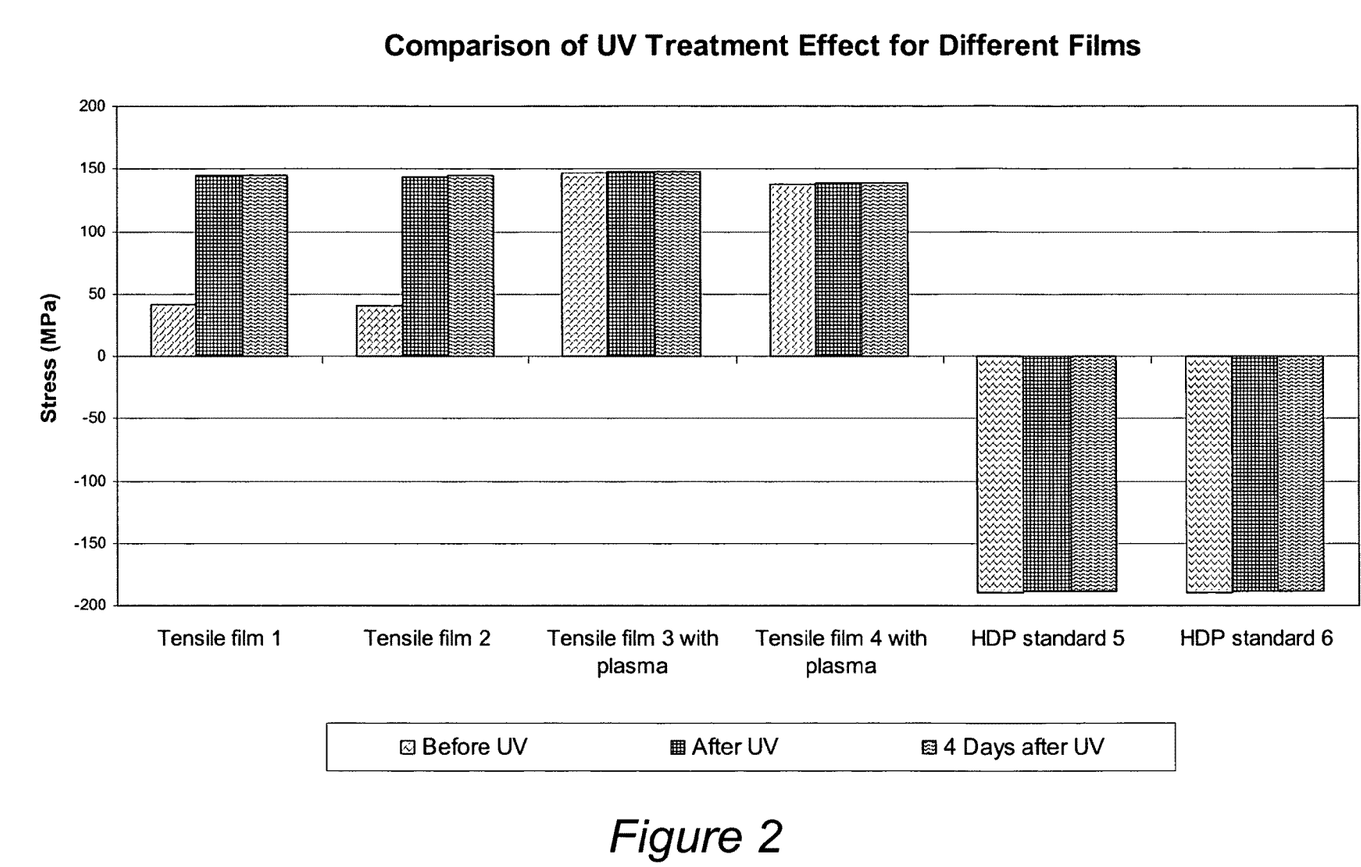
FIG. 2 is a plot depicting the effect on film stress by process trends for selected HDP process parameters in accordance with embodiments of the present invention.

Six film blanket films were tested, comparing the effects of UV treatment with or without plasma exposure and the results are plotted on FIG. 2. The thickness and tensile stress values for films deposited using either the deposition operation, as outlined above, or standard HDP deposition conditions were recorded. The deposited films were then all subjected to one of the bond reconstruction treatments comprising UV radiation and optionally plasma exposure. All deposition and plasma treatments took place in an HDP chamber. The UV treatments took place in Novellus Sola. The tensile stress was measured for all film samples before and after a UV treatment. Four days after the UV treatment, the measurements were taken again to determine whether ambient exposure resulted in hydrolysis. Table 1 below summarizes the tensile stress values for each of the films before and after UV radiation treatments in the bond reconstruction treatment.

TABLE 1

| Condition | Thickness (Angstroms) | | | Stress (MPa) | | |
| --- | --- | --- | --- | --- | --- | --- |
| | Before UV Treatment | After UV Treatment | 4 Days after UV | Before UV Treatment | After UV Treatment | 4 Days after UV |
| Tensile film 1 | 6106 | 6077 | 6079 | 42 | 144 | 144 |
| Tensile film 2 | 6167 | 6141 | 6143 | 41 | 143 | 144 |
| Tensile film 3 with plasma | 5973 | 5973 | 5975 | 147 | 148 | 148 |
| Tensile film 4 with plasma | 5990 | 5991 | 5992 | 138 | 139 | 139 |
| HDP standard 5 | 6014 | 6014 | 6015 | −190 | −188 | −188 |
| HDP standard 6 | 6021 | 6021 | 6023 | −190 | −188 | −188 |

As shown by FIG. 2 and Table 1, the films deposited using the deposition phase process described previously (Films 1-4) had higher tensile stress values compared to the films deposited with traditional deposition (Films 5-6). This is an expected result since the deposition conditions were modified to promote silanol group formation, which adds tensile stress within the film. The traditional HDP CVD conditions result in a compressive stress film (negative MPa values). Also note that the UV treatment did not modify the stress and the thickness of standard compressive films. While not wishing to be bound by theory, it is believed that this reflects that very few silanol groups were present in the standard films following deposition. Hence, the UV treatment did not significantly change the bond construction in the film nor change the stress value.

Tensile stress increased significantly for Films 1 and 2 after the UV treatment. The increase resulted in similar tensile stress as the wafers that experienced the HDP plasma treatment. The results also showed that UV treatment did not improve the tensile stress greatly for the wafers that already experienced the HDP plasma treatment. This result indicates that the UV treatments are effective at increasing tensile stress in films that have silanol groups incorporated within. UV treatment is just as effective as the HDP plasma treatment.

Applications

As mentioned previously, methods of the invention may be used to produce high tensile stress oxide films in a number of front-end-of-line (FEOL) integrated circuit applications. Using methods of the invention, high tensile stress films can be deposited in various regions of the device with respect to transistor channel regions to create global strain (uniform strain throughout the device) or local strain (selected regions of strain), as well as uniaxial strain (stress imparted in one surface direction) or biaxial strain (stress imparted in both surface directions). Note that it is generally desirable to impart tensile stress in the channel region of NMOS structures since this increases electron mobility and therefore enhances device performance.

The following description, along with FIGS. 3A-3C, illustrates specific example applications of the present invention. FIG. 3A illustrates a CMOS device with high tensile stress shallow trench isolation (STI) structures, 3B illustrates a CMOS device with high tensile stress pre-metal dielectric (PMD) structures and 3C illustrates a CMOS device with high tensile stress buried oxide in a silicon on insulator (SOI) substrate. The following implementations of high tensile stress oxides may be used alone or in combination. For example, methods of the invention may be used to form one or more high tensile stress STI structures, PMD layers and SOI structures in one device. These example applications are provided to exemplify and more clearly illustrate aspects of the present invention and are in no way intended to be limiting.

FIG. 3A illustrates a simple transistor architecture of CMOS device 300 in accordance with the present invention. The CMOS device 300 has PMOS transistor 302 over oxide 304. PMOS transistor 302 is composed of an n-doped well 306, a conductive gate 308 separated from the n-well 306 by a gate dielectric 310, a p-doped source 312 and a p-doped drain 314. A p-type channel region 316 lies under gate 308. There may also be sidewall spacers 318 on gate 308. The source 312, drain 314 and gate 308 are covered with a layer of self-aligned silicide (salicide) 320. Note that in some cases salicide 320 may additionally be covered with a silicon nitride capping layer (not shown). Shallow trench isolation (STI) structures 322 and 324 lie on either side of PMOS transistor 302 and isolate PMOS transistor 302 from wells 326 and 328 and source 332 and drain 330 of adjacent transistor structures. STI structures 322 and 324 comprise high tensile stress oxides 332 and 334, respectively. High tensile stress oxides 332 and 334 are deposited using HDP methods in accordance with embodiments of the invention. STI structures 322 and 324 may also have thin thermal oxide trench liners 336 and 338 that are deposited prior to deposition of the high tensile stress oxides 332 and 334. The high tensile stress oxides 332 and 334 of STI structures 322 and 324 tend to compress the channel region 316, thereby creating compressive strain and promoting increase mobility of holes in the channel region 316.

FIG. 5B illustrates a simple transistor architecture of CMOS device 340 in accordance with the present invention. High tensile stress pre-metal dielectric (PMD) 341 is deposited over NMOS structure 342 and STI structures 344 and 346. PMD 341 comprises high tensile stress oxide and was deposited using HDP methods in accordance with embodiments of the invention. Vias 348 were etched into PMD 341 and filled with conductive material, followed by deposition and etch of a first metal layer 350. NMOS transistor 342 is composed of a p-doped well 352, a conductive gate 354, an n-doped source 356 and an n-doped drain 358. An n-type channel region 360 lies under gate 354. The source 356, drain 358 and gate 354 are covered with a layer of salicide 362. STI structures 344 and 346 are comprised of oxides 364 and 366, respectively. The high tensile stress PMD 341 transfers stress to the channel region 360, via the source 356 and drain 358 regions, creating tensile strain and promoting increase mobility of electrons in the channel region 360.

FIG. 5C illustrates a simple transistor architecture of CMOS device 370 in accordance with the present invention. The CMOS device 370 has NMOS transistor 371 and STI structures 372 and 373. NMOS transistor 370 is composed of a p-doped well 374, a conductive gate 376, an n-doped source 378, an n-doped drain 379 and an n-type channel region 380. The source 378, drain 379 and gate 376 are covered with a layer of salicide 382. STI structures 372 and 373 are comprised of oxides 384 and 385, respectively. NMOS transistor 371 and STI structures 372 and 373 exist over an oxide layer 386, which exists over silicon on insulator (SOI) substrate 394. SOI substrate 394 comprises a silicon base 392, a buried oxide 390 and an upper silicon layer 388. Buried oxide 390 comprises high tensile stress oxide and was deposited using HDP methods in accordance with embodiments of the invention. High tensile stress buried oxide 390 transfers stress to channel region 380 creating tensile strain and promoting increase mobility of electrons in the channel region 380.

Apparatus

The present invention may be implemented in a high-density plasma chemical vapor deposition (HDP-CVD) tool equipped with one or more HDP-CVD deposition reactors and one or more UV treatment reactors for in-situ UV radiation. Other configurations could comprise an HDP-CVD reactor equipped with UV apparatus for the UV radiation in the bond reconstruction phase.

HDP-CVD reactors are well known in the art. Such a reactor may take many different forms, including electron cyclotron resonance (ECR) and Helicon wave. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or translation). In some embodiments, silicon dioxide deposition and treatment occur in one reactor. In other embodiments, a wafer undergoing silicon dioxide deposition and treatment is transferred from one station to another within the reactor during the process. In further embodiments, a wafer undergoing silicon dioxide deposition and treatment is transferred, under vacuum, from one reactor to another with the same wafer processing tool. While in process, each wafer is held in place by a pedestal, wafer chuck and/or other wafer holding apparatus. For certain operations in which the wafer is to be temperature controlled, the apparatus may include a heater such as a heating plate or a coolant system. Examples of suitable reactors include the Speed™ reactor, available from Novellus Systems, Inc. of San Jose, Calif., and the Ultima™ reactor, available from Applied Materials, Inc. of Santa Clara, Calif.

Figure 4:
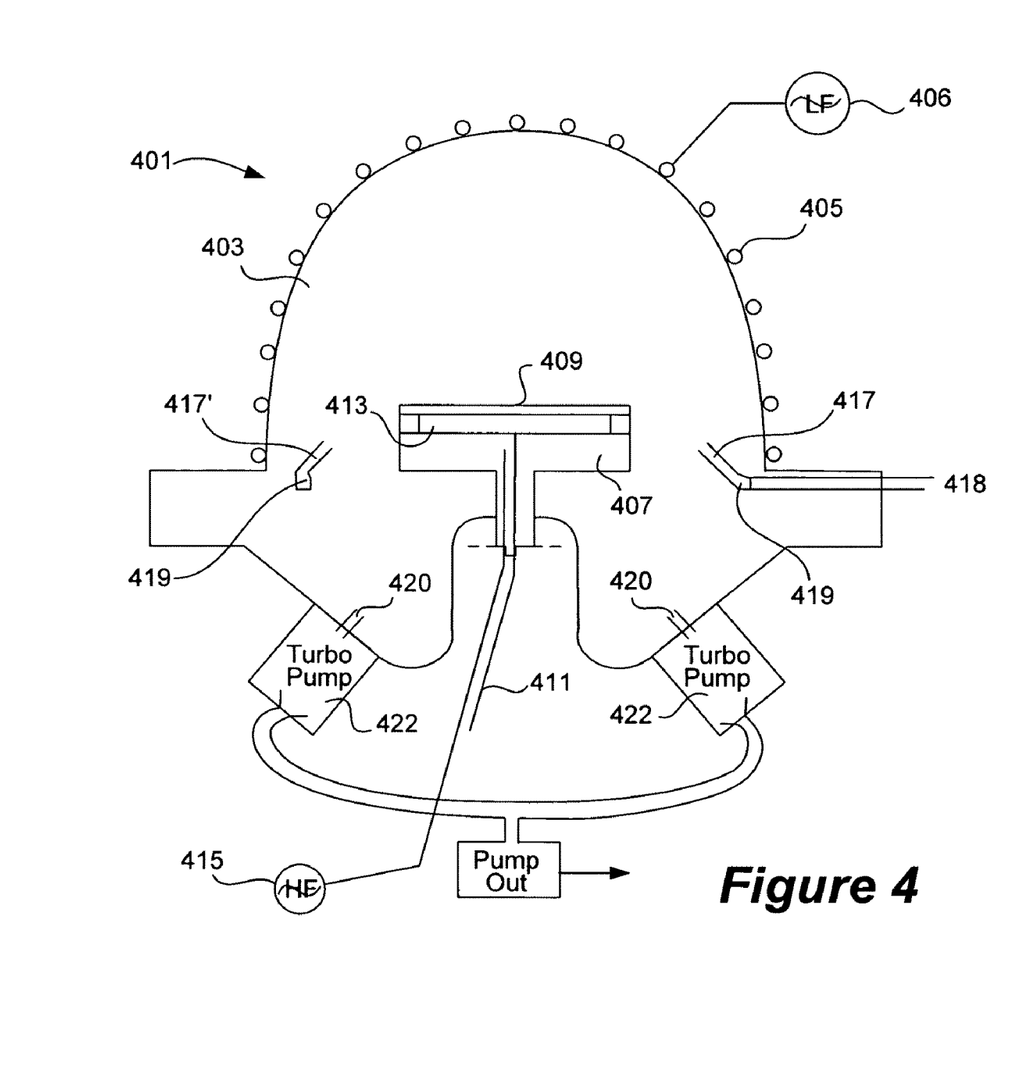
FIG. 4 is a schematic representation of high density plasma apparatus suitable for implementation of methods in accordance with embodiments of the invention.

FIG. 4 provides a simple block diagram of a suitable HDP CVD reactor for implementation of the present invention. As shown, a reactor 401 includes a process chamber 403 which encloses other components of the reactor and serves to contain the plasma generated by an electrode 405. In one example, the process chamber walls are made from aluminum, aluminum oxide, and/or other suitable material. Electrode 405 is powered by a "low frequency" RF source 406. The power and frequency supplied by source 406 is sufficient to generate high-density plasma from the process gas.

Within the reactor, a wafer pedestal 407 supports a substrate 409. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 411 for supplying heat transfer fluid controls the temperature of substrate 409. In some embodiments, the heat transfer fluid comprises at least one of helium, nitrogen, and argon gas. The heat transfer fluid is supplied to a space 413 between the surface of the substrate and a surface of the chuck. The heat transfer fluid serves to make the wafer temperature close to that of the ESC. However, to perform cooling (or heating) the ESC itself needs to have a coolant supply or heat source, which may be an electric heater or heat exchanging conduits flowing another heat transfer fluid embedded in the chuck.

In accordance with the invention, the wafer temperature should be maintained sufficiently cool to facilitate hydroxyl group formation with the silicon dioxide film, preferably below about 250° C. The wafer chuck and heat transfer fluid system can facilitate maintaining the appropriate wafer temperatures.

An RF source 415 serves to electrically bias substrate 409 and draw charged precursor species towards the substrate during the deposition reaction. Electrical energy from source 415 is coupled to substrate 409 via an electrode or capacitive coupling, for example. Note that the bias applied to the substrate need not be an RF bias. Other frequencies and DC bias may be used as well. In a specific embodiment, power source 415 supplies a radio frequency bias to the substrate at between about 500 W and about 6,000 W of power.

The process gases, in this case a silicon-containing gas, an oxygen-containing gas and a hydrogen-containing gas, are introduced via one or more inlets 417 and 418. The gases may be premixed or not. Preferably, the process gas is introduced through a gas supply inlet mechanism including orifices or injection tubes. In some embodiments, at least some of the orifices orient the process gas along an axis of injection intersecting an exposed surface of the substrate at an acute angle. Further, the gas or gas mixtures may be introduced from a primary gas ring 419, which may or may not direct the gases toward the substrate surface. Injectors may be connected to the primary gas ring 419 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions— including toward the substrate. Process gases exit chamber 403 via an outlet 420. One or more vacuum pumps (e.g., a turbomolecular pumps 422) typically draw process gases out and maintain a suitably low pressure within the reactor.

Reactor pressure is held at a value necessary to sustain the high-density plasma. Preferably the process vessel is maintained at a pressure of at most about 100 mTorr. For many applications, however, the pressure is maintained between about 0.5 and 30 mTorr; most preferably between about 1 and 20 mTorr. In one embodiment of the invention, the pressure is maintained at about 15 mTorr during the deposition process.

For a typical apparatus, the source power applied to the upper electrode (for generating the plasma) can typically vary from 1 kW to 20 kW, and the bias power can typically reach at least about 0.1 W/cm$^2$. Note that preferred power will depend on the substrate size (e.g., 200 or 300 mm diameter)

and the requirements of the specific process being used. As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 50 kHz and 50 MHz. The frequency range applied to the upper, plasma-generating electrode is typically between about 100 kHz and 2.5 GHz.

The UV radiation can also be implemented in many different types of apparatus. In some embodiments, the apparatus will be a wafer processing tool that includes one or more chambers (sometimes referred to as reactors or process vessels) that house one or more wafers and are suitable for wafer processing. At least one chamber will include a UV source. One or more of the other chambers may be a HDP chamber. A single chamber may be employed for all operations of the invention or separate chambers may be used. Each chamber may house one or more wafers (substrates) on one or more stations for processing. Separate stations may be employed for each operation of the invention. The one or more chambers maintain the wafer in a defined position or positions (with or without motion within that position, e.g., rotation, vibration, or translation) during procedures of the invention. For certain operations in which the wafer temperature is to be controlled, the apparatus may include a heating or cooling platen.

Figure 5:
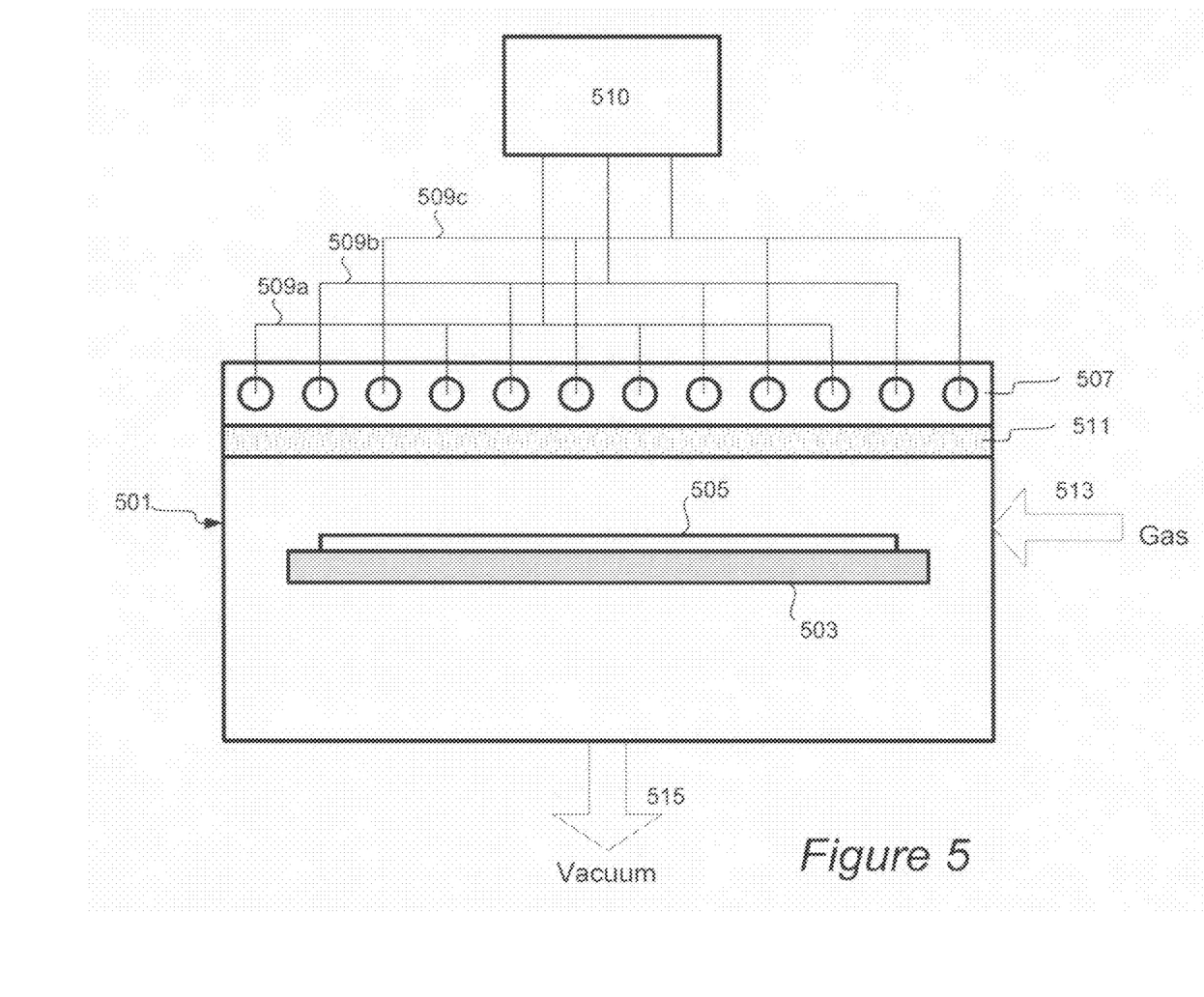
FIG. 5 is a schematic representation of ultraviolet apparatus suitable for UV radiation treatment in accordance with embodiments of the invention.

FIG. 5 is a schematic diagram of an example chamber 501 in accordance with the invention. Chamber 501 is capable of holding a vacuum and/or containing gases at pressures above atmospheric pressure. For simplicity, only one chamber 501 is shown. It is noted that in preferred embodiments, chamber 501 is one station in a multi-station apparatus (entire apparatus not shown), although chamber 501 could alternatively be part of a stand-alone single station apparatus. Suitable multi-station apparatus include, for example, the Novellus Systems, Inc. SOLA, and modified Sequel and Vector systems.

A substrate holder 503 secures a wafer 505 in a position such that light from a UV light source array 507 can irradiate wafer 505. Substrate holder 503 can have a heater (not shown) that can heat the substrate to defined temperatures, or could be connected to a chiller that can cool the substrate. Both the heater and chiller can be controlled by a temperature controller (not shown). Chamber 501 is configured with a gas inlet 513, which is connected to a gas source (not shown), and with a vacuum outlet 515, which is connected to a vacuum pump (not shown). The amount of gas introduced into the chamber 501 can be controlled by valves and mass flow controllers (not shown) and pressure is measured by pressure gauges (not shown).

In this example, the UV light source array 507 is mounted outside the chamber 501. In alternate embodiments, the UV light source array may be housed inside the chamber 501. UV light source array 507 includes an array of individual UV sources such as mercury vapor or xenon lamps. Note that the invention is not limited to mercury vapor or xenon lamps as UV light sources and other suitable light sources include deuterium lamps or lasers (e.g., excimer lasers and tunable variations of various lasers). Various optical elements, such as reflectors, may be required to direct the UV light toward portions of the substrate. Methods for directing the light at different portions of the substrate at different times may be required as well. A scanning mechanism may be used for this purpose. A window 511 made of quartz, sapphire or other suitable material is positioned between UV light source array 507 and wafer 505 to provide vacuum isolation. Filters can also be used to remove unwanted spectral components from particular sources to "tune" the sources.

The UV light source array 507 may be comprised of one or more types of UV sources, for example an array of three types of UV sources, each type providing UV radiation with a different wavelength distribution. The UV sources are electrically connected to each other (509a, 509b and 509c) and controlled by control system 510, which controls when each of the various UV sources is illuminated. Control system 510 is typically, but not limited to, a computer processing system such as a PC or workstation. Of course, any number and types of individual light sources in any suitable configuration can be used.

Note that the light source array and control configuration of FIG. 5 is only an example of a suitable configuration. In general, it is preferable that the lamps are arranged to provide uniform UV radiation to the wafer. The UV sources may be aligned in a planar array as shown in 507 or may be in another two-dimensional or three-dimensional configuration. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, reflectors and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp vs. xenon lamp vs. deuterium lamp vs. excimer laser, etc.) as well as the use of filters that tailor the spectral distribution. In addition, the spectral distributions of some lamps can be tuned by doping the gas mixture in the lamp with particular dopants such as iron, gallium, etc.

It should be understood that the apparatus depicted in FIG. 5 is only an example of a suitable apparatus and other designs for other methods involved in previous and/or subsequent processes may be used. Other examples of apparatus suitable for implementing the present invention are described in commonly assigned co-pending application Ser. Nos. 11/115,576 filed Apr. 26, 2005, 10/800,677 filed Mar. 11, 2004 and 10/972,084 filed Oct. 22, 2004, incorporated by reference herein.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. A method of forming a silicon dioxide film having +tensile stress, the method comprising:
   (a) providing a substrate on a substrate support in a reaction chamber, the reaction chamber capable of maintaining a high density plasma;
   (b) exposing the substrate to the high density plasma using at least a silicon-containing precursor, an oxygen source, and a hydrogen source while maintaining a substrate temperature of no greater than about 400° C. to thereby form a silicon dioxide film on the substrate, the silicon dioxide film comprising silanol groups; and
   (c) exposing the silicon dioxide film to UV radiation remove at least water or —OH groups from the silicon dioxide film, thereby increasing tensile stress in the silicon dioxide film
   wherein the tensile stress of the silicon dioxide film after (c) is about 50 MPa or greater.

2. The method of claim 1, wherein the silicon dioxide film is used as a dielectric in shallow trench isolation (STI) and pre-metal dielectric (PMD).

3. The method of claim 1, wherein the tensile stress of the silicon dioxide film after (c) is about 200 MPa to 300 MPa.

4. The method of claim 1, wherein exposure to the high density plasma in (b) is performed in a high density plasma chemical vapor deposition (HDP-CVD) reactor.

5. The method of claim 1, wherein the high density plasma in (b) further comprises one or more inert gases.

6. The method of claim 1, wherein the silicon-containing precursor is a silane.

7. The method of claim 1, wherein the oxygen source comprises one or more of $O_2$, $H_2O$, $CO_2$, $N_2O$ and $NO_2$.

8. The method of claim 1, wherein the hydrogen source is one or more of $H_2$, $H_2O$, $CH_4$, and $SiH_4$.

9. The method of claim 1, wherein the silicon-containing precursor is $SiH_4$, the oxygen source is $O_2$ and the hydrogen source is $H_2$.

10. The method of claim 9, wherein the $SiH_4$ to $O_2$ ratio ($SiH_4:O_2$) is between about 1:5 and about 1:1.

11. The method of claim 1, wherein the substrate temperature in (b) is between about −10° C. and about 400° C.

12. The method of claim 1, wherein the substrate temperature in (b) is between about 50° C. and about 200° C.

13. The method of claim 1, wherein exposing the substrate to the high density plasma in (b) occurs for less than about 420 seconds.

14. The method of claim 1, wherein the substrate bias power is less than about 8,000 Watts.

15. The method of claim 1, wherein the high density plasma is formed using a source power of no greater than about 8,000 Watts.

16. The method of claim 1, wherein the UV radiation in (c) originates from excimer laser, mercury vapor lamps, or xenon lamps.

17. The method of claim 1, wherein the exposing operation in (c) further comprises a high density plasma treatment.

18. The method of claim 1, wherein the exposing operation in (c) further comprises a thermal treatment.

19. The method of claim 1, wherein exposing operation in (c) further comprises exposing the substrate to an oxidizing gas.

20. The method of claim 19, wherein the oxidizing gas comprises one or more of $O_2$, $O_3$, $H_2O$, $CO_2$, $N_2O$, and $NO_2$.

21. The method of claim 1, wherein the UV radiation has a power density of about 1-5 $W/cm^2$ and a wavelength from about 100-400 nm, and the exposure is conducted at a temperature less than 700° C. for a period less than about 20 minutes.

* * * * *